United States Patent
Camerlenghi et al.

(10) Patent No.: US 7,078,294 B2
(45) Date of Patent: Jul. 18, 2006

(54) SEALING METHOD FOR ELECTRONIC DEVICES FORMED ON A COMMON SEMICONDUCTOR SUBSTRATE AND CORRESPONDING CIRCUIT STRUCTURE

(75) Inventors: Emilio Camerlenghi, Bergamo (IT); Alfonso Maurelli, Sulbiate (IT); Daniela Peschiaroli, Milan (IT); Paola Zabberoni, Monza (IT)

(73) Assignee: STMicroelectonics S.r.l., Agrate Brianza (IT)

( * ) Notice: Subject to any disclaimer, the term of this patent is extended or adjusted under 35 U.S.C. 154(b) by 0 days.

(21) Appl. No.: 10/971,774

(22) Filed: Oct. 22, 2004

(65) Prior Publication Data

US 2005/0112905 A1    May 26, 2005

(30) Foreign Application Priority Data

Oct. 22, 2003   (EP)   ................................. 03425687

(51) Int. Cl.
*H01L 21/336*   (2006.01)
(52) U.S. Cl. ................................................. 438/258
(58) Field of Classification Search ................. 438/258
See application file for complete search history.

(56) References Cited

U.S. PATENT DOCUMENTS

| 6,468,867 | B1 | 10/2002 | Lai et al. ...................... 438/275 |
| 6,506,647 | B1 * | 1/2003 | Kuroda et al. .............. 438/275 |
| 6,630,378 | B1 | 10/2003 | Tanigawa .................... 438/210 |
| 6,798,002 | B1 * | 9/2004 | Ogle et al. ................... 257/295 |
| 2003/0151069 | A1 | 8/2003 | Sugimae et al. ............ 257/200 |

OTHER PUBLICATIONS

Patent Abstracts of Japan, vol. 1996, No. 10, Oct. 31, 1996 & JP 08 153860 A, Mitsubishi Electric Corp., Jun. 11, 1996.

* cited by examiner

*Primary Examiner*—Matthew Smith
*Assistant Examiner*—Lex H. Malsawma
(74) *Attorney, Agent, or Firm*—Lisa K. Jorgenson; Allen, Dyer, Doppelt, Milbrath & Gilchrist, P.A.

(57) ABSTRACT

A method for sealing electronic devices formed on a semiconductor substrate includes forming at least one first conductive layer on a first portion of the semiconductor substrate for defining electronic devices, and forming a second conductive layer on a second portion of semiconductor substrate for also defining electronic devices. First regions are formed in the at least one first conductive layer for defining electronic devices, and a first sealing layer is formed on the whole semiconductor substrate to seal the first regions. Second regions are formed in the second conductive layer for defining electronic devices, and a second sealing layer is formed on the whole semiconductor substrate to seal the second regions.

12 Claims, 2 Drawing Sheets

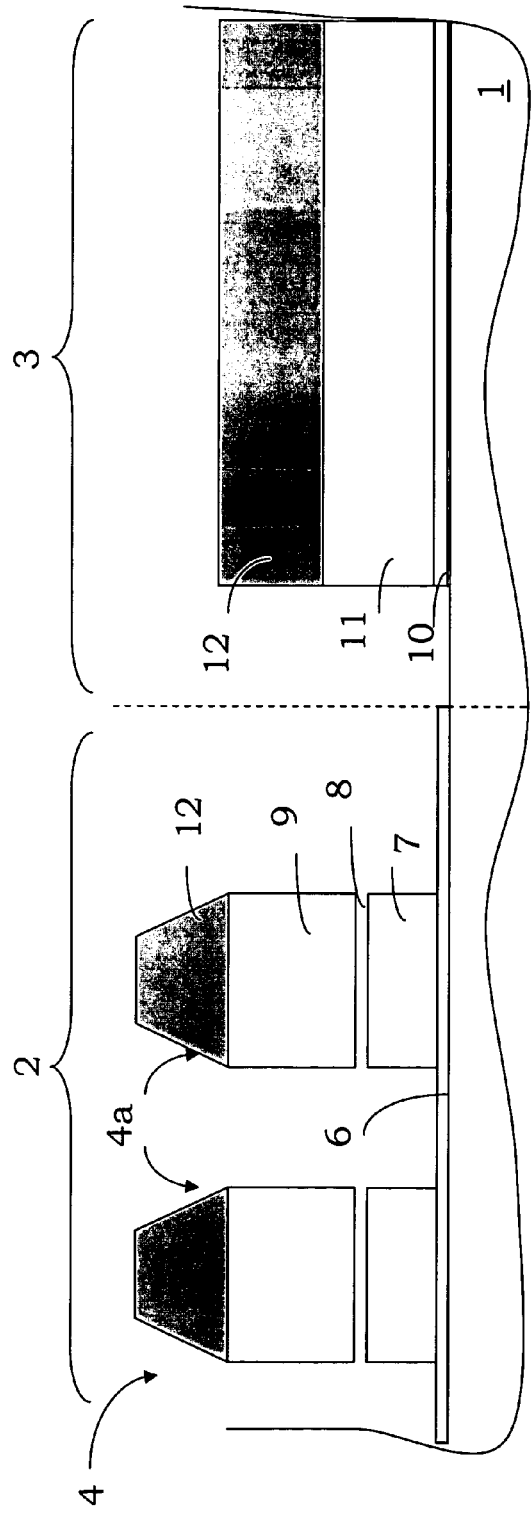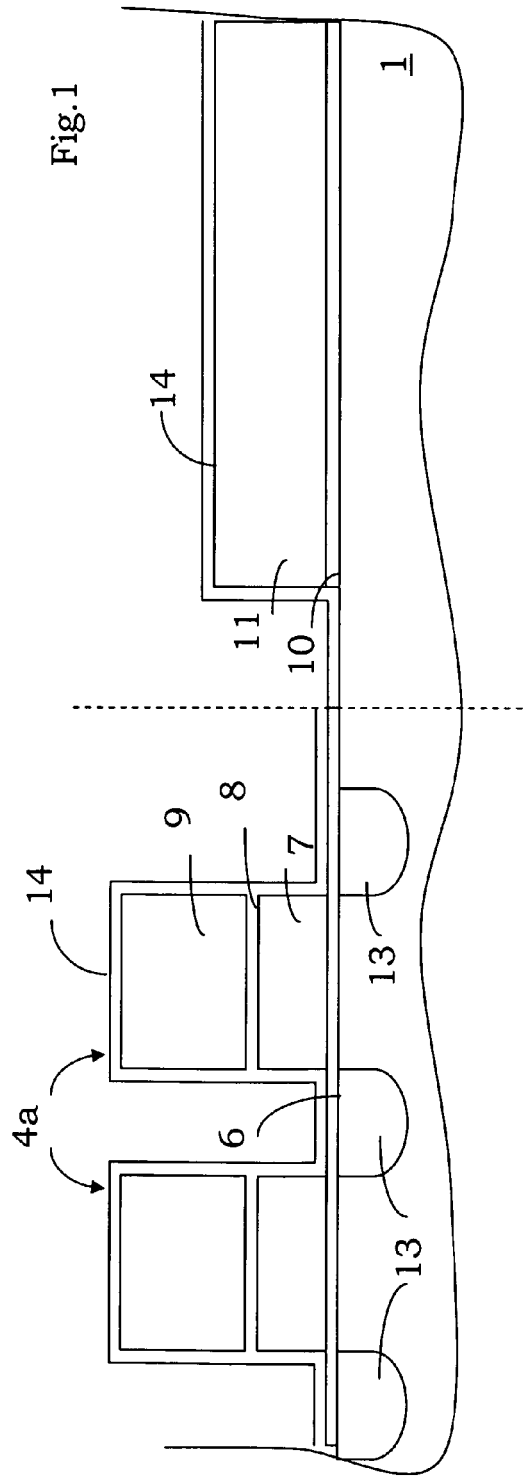

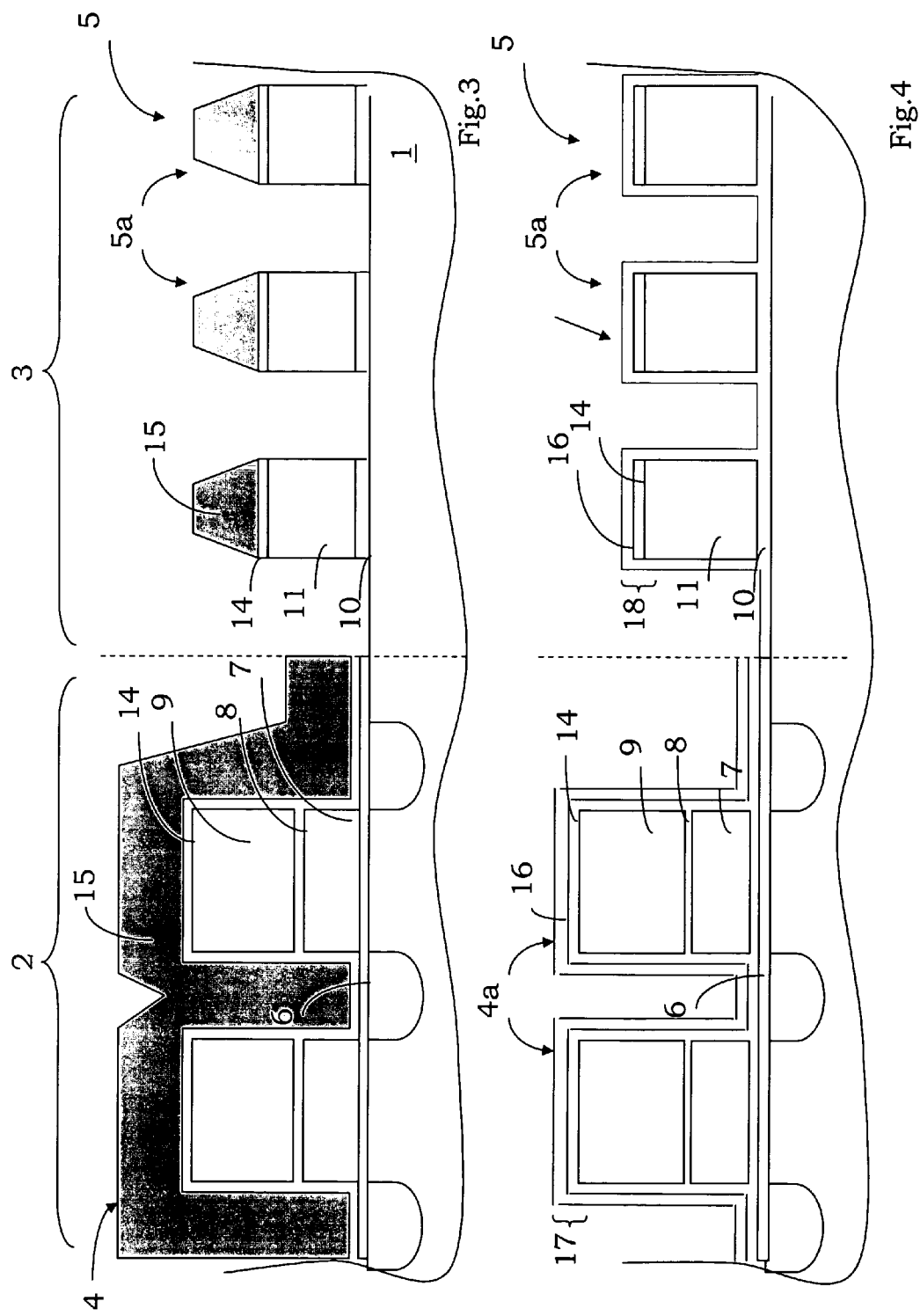

SEALING METHOD FOR ELECTRONIC DEVICES FORMED ON A COMMON SEMICONDUCTOR SUBSTRATE AND CORRESPONDING CIRCUIT STRUCTURE

FIELD OF THE INVENTION

The present invention relates to a method for sealing electronic devices formed on a common semiconductor substrate, and to a corresponding circuit structure. The invention relates more particularly, but not exclusively, to a differential sealing method for non-volatile memory cells with a double polysilicon level and transistors associated therewith formed on a common semiconductor substrate. The following description is made with reference to this field of application for convenience of illustration only.

BACKGROUND OF THE INVENTION

The integration on a common semiconductor substrate of different electronic devices, such as traditional transistors and non-volatile memory cells with a double polysilicon level for example, has always posed the problem of reconciling the different needs for sealing these two different types of electronic devices. Sealing refers to the manufacturing process where one or more layers are formed after the polysilicon layer forming the gate region of the transistors and memory cells have been formed. This manufacturing process thus seals these electronic devices.

Typically, memory cells undergo a high quality sealing step to ensure the retention properties of the charge stored in the floating gate region. For transistors, a protection layer formed as part of this sealing step is used to provide protection from the subsequent process steps.

A prior art approach provides the use of two different photolithographic masks to first define the gate regions in a memory matrix and then those of the circuitry, even if the order is not significant. Afterwards, the simultaneous oxidation of both electronic devices occurs, thus sealing the devices by a single sealing layer.

This approach has several drawbacks as the size of the electronic devices decreases. In fact, the continuous reduction in the size of the electronic devices pushes transistors to require thinner sealing layers, and heat treatments with lower temperatures. This is in contrast to memory cells requiring thicker layers in addition to higher quality requirements.

SUMMARY OF THE INVENTION

In view of the foregoing background, an object of the present invention is to provide an independent sealing method for electronic devices formed on a common semiconductor substrate that reduces jeopardizing performance and reliability of these devices, and may not require further steps or masks beyond those for the traditional process flow.

This and other objects, advantages and features in accordance with the present invention are provided by a method for sealing electronic devices formed on a semiconductor substrate comprising forming at least one first conductive layer on a first portion of the semiconductor substrate, and forming a second conductive layer on a second portion of the semiconductor substrate. A first plurality of regions in the at least one first conductive layer is formed for defining electronic devices on the first portion of the semiconductor substrate. A first sealing layer is formed on the first plurality of regions for sealing the electronic devices, and on the second conductive layer. A second plurality of regions is formed in the second conductive layer for defining electronic devices on the second portion of the semiconductor substrate. A second sealing layer is formed on the second plurality of regions for sealing the electronic devices, and on the first sealing layer on the first plurality of regions. The first and second sealing layers may be formed with different thicknesses. In addition, the first and second sealing layers may be formed immediately after defining the electronic devices.

Another aspect of the present invention is directed to an integrated circuit comprising a semiconductor substrate including first and second portions, and a plurality of first electronic devices on the first portion of the semiconductor substrate. Each first electronic device may include a first region comprising at least one first conductive layer projecting from the semiconductor substrate. A first sealing layer is on the plurality of first electronic devices. A plurality of second electronic devices is on the second portion of the semiconductor substrate. Each second electronic device may include a second region comprising a second conductive layer projecting from the semiconductor substrate. A second sealing layer is on the plurality of second electronic devices, and on the first sealing layer on the plurality of first electronic devices. The second sealing layer may have a thickness less than a thickness of the first sealing layer.

BRIEF DESCRIPTION OF THE DRAWINGS

The features and advantages according to the invention will be apparent from the following description of an embodiment thereof given by way of a non-limiting example with reference to the attached drawings. In the drawings:

FIGS. 1 to 4 are cross-sectional views of different portions of a semiconductor substrate based upon a manufacturing method according to the invention.

DETAILED DESCRIPTION OF THE PREFERRED EMBODIMENTS

With reference to FIGS. 1 to 4, a method for sealing electronic devices formed on a common semiconductor substrate in an independent manner and the corresponding circuit structure will now be described. The method steps described below do not form a complete process flow for manufacturing integrated circuits. The present invention can be implemented together with the integrated circuit manufacturing techniques presently used in this field, and only those commonly used process steps necessary to understand the present invention are present.

The figures representing cross sections of portions of a circuit structure during the manufacturing process are not drawn to scale, but they are drawn instead to show the important features of the invention. Referring now to FIGS. 3 and 4, a circuit structure integrated on a semiconductor substrate 1 comprises a first plurality of electronic devices 4.

The electronic devices 4 are non-volatile memory cells for example. Each of these electronic devices 4 comprises a region 4a projecting from the semiconductor substrate 1. Each region 4a is formed by one or more conductive layers 7, 9 that are electrically insulated from each other by an insulating layer 8. The region 4a is coated with a first sealing layer 17 having a first thickness. The first sealing layer 17 seals these electronic devices 4.

The first sealing layer 17 comprises a plurality of insulating layers 14, 16. Moreover, the first sealing layer 17 advantageously covers a portion of the exposed semiconductor substrate 1 between the single electronic devices 4.

The semiconductor substrate 1 also comprises a second plurality of electronic devices 5. The electronic devices 5 are traditional transistors for example. Each electronic device 5 comprises a region 5a projecting from the semiconductor substrate 1. Each region 5a is formed by at least one conductive layer 11 for example. The region 5a is coated with a second sealing layer 18 for sealing the electronic devices 5.

The second sealing layer 18 has a lower thickness on the semiconductor substrate 1 than the thickness of the first sealing layer 17 covering the electronic devices 4. Moreover, the second sealing layer 18 advantageously has a lower thickness on the vertical walls of the region 5a as compared to the thickness on the top of this region 5a. It is thus possible to form very closely spaced electronic devices 5 allowing for a higher integration scale. The second sealing layer 18 comprises at least one insulating layer 16.

The manufacturing method of a circuit structure according to the invention will now be described. In particular, and by way of example, a method for integrating non-volatile flash memory cells with transistors formed in CMOS technology is described below.

A matrix 2 of cells with associated control circuitry 3 is formed on a semiconductor substrate 1. The cell matrix 2 comprises a plurality of non-volatile memory cells 2, while the control circuitry 3 comprises a plurality of transistors 5.

As it is well known, a manufacturing process of the cell matrix 2 provides the following formation on the semiconductor substrate 1, in cascade, of a first insulating layer 6 such as silicon oxide, a first conductive layer 7 such as polysilicon, a second insulating layer 8 such as silicon oxide, and a second conductive layer 9 such as polysilicon. The formation of a third insulating layer 10 such as silicon oxide, and a third conductive layer 11 such as polysilicon, is provided to form the circuitry.

The third conductive layer 11 may be formed simultaneously with the second conductive layer 9. The third insulating layer 10 may be formed simultaneously with the second insulating layer 8.

A first photoresist material layer 12 is then deposited on the whole semiconductor substrate 1. By using a traditional photolithographic technique, the first photoresist layer 12 is etched to define a plurality of gate regions 4a of the memory cells 4. A portion of this first photoresist material layer 12 in the circuitry 3 is left to screen the third conductive layer 11, as shown in FIG. 1.

With definition of the gate regions 4a of the memory cells 4 being completed through an etching step of the second conductive layer 9, of the second insulating layer 8 and of the first conductive layer 7, in cascade, the first photoresist material layer 12 is then removed and implants are carried out to form, in a traditional way, source and drain regions 13 of the memory cells 4.

These implants are configured to improve performance of the memory cells 4. The memory cells 4 are then sealed for forming a first insulating or sealing layer 14 through a high-temperature fast oxidation step. The first sealing layer 14 is between 3 to 7 nm thick, with a typical thickness of about 4 nm for example.

The sealing layer 14 coats not only the gate regions 4a of the memory cells 4, but it also covers a portion of the semiconductor substrate 1 left exposed in the matrix 2, and the third conductive layer 11 not yet defined in the circuitry 3, as shown in FIG. 2. A second photoresist material layer 15 is then deposited on the whole semiconductor substrate 1.

Using a traditional photolithographic technique, this second photoresist layer 15 is then etched to define a plurality of gate regions 5a of transistors 5. A portion of the second photoresist material layer 15 on the matrix 2 is left to screen the memory cells 4 of the matrix 2, as shown in FIG. 3.

In particular, the circuitry portions not covered by the photoresist layer 15 undergo an etching step to remove the first sealing layer 14, and then an etching step to remove the conductive layer 11. After the photoresist layer 15 is removed, transistors 5 are sealed by forming a second thin insulating or sealing layer 16 through an oxidation step. The thickness of the second thin sealing layer 16 is between 1 and 3 nm, with a typical thickness of about 2 nm for example. The second thin sealing layer 16 completely covers the first sealing layer 14.

Therefore, according to the invention, a first sealing layer 17 is thus formed, comprising the first sealing layer 14 and the second sealing layer 16, which completely coats the gate regions 4a of the memory cells 4. A second sealing layer 18 is formed, which completely coats the gate regions 5a of transistors 5 to seal them. The second sealing layer 18 comprises the second sealing layer 16 and portions of the first sealing layer 14 which are on the upper portion of the gate regions 5a of transistors 5.

The definition step of the gate regions 5a of transistors 5, performed after the deposition step of the first sealing layer 14, forms projection regions having portions of the first sealing layer 14 on the top thereof, but not on the side walls thereof. The formation of the second thin sealing layer 16 does not affect the electrical capacities of the memory cells 4. This is because the source and drain regions 13 in the matrix 2 have already been formed, and because the heat treatments involved in the formation of the second thin sealing layer 16 are performed at lower temperatures than the temperatures subjected on the memory cells 4 for the specific sealing thereof.

The manufacturing method according to the invention is completed using conventional processing. With the method according to the invention, both traditional memory cells 4 and traditional transistors 5 can be successfully integrated on the common semiconductor substrate 1. This is done without penalizing the performances and the reliability. The differences with respect to the prior art methods are as follows.

Each definition of the projecting 4a and gate 5a regions, first in the matrix 2 and then in the circuitry 3, is followed by a respective sealing step which is optimized by using sealing layers 14, 16 of different thickness and/or materials. The etching step of the conductive layer 11 of the circuitry 3 to define gate regions 5a includes the following: removing the first sealing layer 14 formed also on the conductive layer 11 of the circuit 3; and etching the conductive layer 11 through a highly selective etching step towards the insulating layer 10.

In an alternate embodiment of the method according to the invention immediately after sealing the memory cells 4 an additional mask is used to leave only the control circuitry 3 exposed. The sealing layer 14 is then removed from the conductive layer 11 before defining the gate regions 5a in the circuitry 3. In this embodiment, the second sealing layer 18 sealing the gate regions 5a of transistors 5 is only formed by the second sealing layer 16. This alternate embodiment is advantageously applied when the materials used to form the sealing layer 14 for sealing the memory cells 4 are different and should be removed to allow the conductive layer 11 to be correctly etched to define gate regions 5a in the circuitry 3.

In conclusion, the method according to the invention allows topologies of electronic devices requiring different types of sealing to be integrated without jeopardizing the individually optimized performance and reliability for each device, with low or no cost. The sealing step of these electronic devices is achieved by sealing layers with different thicknesses, and also including materials being formed immediately after defining the devices of the matrix 2 and the circuitry 3.

That which is claimed is:

1. A method for sealing electronic devices formed on a semiconductor substrate comprising:
   forming at least one first conductive layer on a first portion of the semiconductor substrate;
   forming a second conductive layer on a second portion of the semiconductor substrate;
   forming a first plurality of regions in the at least one first conductive layer for defining first electronic devices on the first portion of the semiconductor substrate;
   forming a first sealing layer on the first plurality of regions for sealing the first electronic devices, and on the second conductive layer;
   forming a second plurality of regions in the second conductive layer for defining second electronic devices on the second portion of the semiconductor substrate and so that the second electronic devices have at least portions of the first sealing layer thereon; and
   forming a second sealing layer on the second plurality of regions for sealing the second electronic devices having at least portions of the first sealing layer thereon, and on the first sealing layer sealing the first electronic devices.

2. A method according to claim 1, wherein the first sealing layer has a first thickness, and the second sealing layer has a second thickness less than the first thickness.

3. A method according to claim 2, wherein the second thickness is within a range of about 1 to 3 nm, and the first thickness is within a range of about 3 to 7 nm.

4. A method according to claim 1, further comprising removing portions of the first sealing layer on the second conductive layer before forming the second plurality of regions.

5. A method according to claim 1, wherein forming the first plurality of regions comprises:
   forming a photoresist layer on the first and second conductive layers;
   etching the photoresist layer on the first conductive layer for forming the first plurality of regions; and
   removing the photoresist layer.

6. A method according to claim 1, wherein forming the second plurality of regions comprises:
   forming a photoresist layer on the first sealing layer on the first plurality of regions, and on the second conductive layer;
   etching the photoresist layer on the second conductive layer for forming the second plurality of regions; and
   removing the photoresist layer.

7. A method according to claim 1, wherein forming the at least one first conductive layer comprises forming a lower conductive layer, a dielectric layer on the lower conductive layer, and an upper conductive layer on the dielectric layer.

8. A method according to claim 7, wherein the upper conductive layer is formed when the second conductive layer is formed.

9. A method for making an integrated circuit comprising:
   forming at least one first conductive layer on a first portion of the semiconductor substrate;
   forming a second conductive layer on a second portion of the semiconductor substrate;
   forming a plurality of memory cells in the at least one first conductive layer and the first portion of the semiconductor substrate;
   forming a first sealing layer on the plurality of memory cells, and on the second conductive layer;
   forming a plurality of transistors in the second conductive layer on the second portion of the semiconductor substrate and so that the plurality of transistors have at least portions of the first sealing layer thereon; and
   forming a second sealing layer on the plurality of transistors having at least portions of the first sealing layer thereon, and on the first sealing layer sealing the plurality of memory cells, the second sealing layer having a thickness less than a thickness of the first sealing layer.

10. A method according to claim 9, wherein the second sealing layer has a thickness within a range of about 1 to 3 nm, and the first sealing layer has a thickness within a range of about 3 to 7 nm.

11. A method according to claim 9, wherein forming the plurality of memory cells comprises:
   forming a photoresist layer on the first and second conductive layers;
   etching the photoresist layer on the first conductive layer for forming the plurality of memory cells; and
   removing the photoresist layer.

12. A method according to claim 9, wherein forming the plurality of transistors comprise:
   forming a photoresist layer on the first sealing layer on the plurality of memory cells, and on the second conductive layer;
   etching the photoresist layer on the second conductive layer for forming the plurality of transistors; and
   removing the photoresist layer.

* * * * *

UNITED STATES PATENT AND TRADEMARK OFFICE
CERTIFICATE OF CORRECTION

PATENT NO. : 7,078,294 B2
APPLICATION NO. : 10/971774
DATED : July 18, 2006
INVENTOR(S) : Camerlenghi et al.

Page 1 of 1

It is certified that error appears in the above-identified patent and that said Letters Patent is hereby corrected as shown below:

| | |
|---|---|
| Cover Page, Section 73 | Delete: "STMicroelectonics S.r.l." Insert: --STMicroelectronics S.r.l.-- |
| Column 5, Line 26 | Delete: "and so" Insert: --so-- |
| Column 6, Line 24 | Delete: "and so" Insert: --so-- |
| Column 6, Line 45 | Delete: "comprise" Insert: --comprises-- |

Signed and Sealed this

Third Day of April, 2007

JON W. DUDAS
*Director of the United States Patent and Trademark Office*